United States Patent
Watanabe et al.

(10) Patent No.: US 9,536,755 B2
(45) Date of Patent: *Jan. 3, 2017

(54) LAMINATING SYSTEM

(71) Applicant: SEMICONDUCTOR ENERGY LABORATORY CO., LTD., Atsugi-shi, Kanagawa-ken (JP)

(72) Inventors: Ryosuke Watanabe, Kanagawa (JP); Hidekazu Takahashi, Kanagawa (JP); Takuya Tsurume, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 60 days.

This patent is subject to a terminal disclaimer.

(21) Appl. No.: 14/217,519

(22) Filed: Mar. 18, 2014

(65) Prior Publication Data

US 2014/0220745 A1    Aug. 7, 2014

Related U.S. Application Data

(63) Continuation of application No. 12/403,988, filed on Mar. 13, 2009, now Pat. No. 8,698,156, and a
(Continued)

(30) Foreign Application Priority Data

Jun. 2, 2004  (JP) ................................. 2004-165104

(51) Int. Cl.
*H01L 21/56* (2006.01)
*H01L 21/67* (2006.01)
(Continued)

(52) U.S. Cl.
CPC .............. *H01L 21/56* (2013.01); *B32B 37/20* (2013.01); *G06K 19/0775* (2013.01);
(Continued)

(58) Field of Classification Search
CPC ................... H01L 21/67126; H01L 21/67132; H01L 21/67144; H01L 21/6835
(Continued)

(56) References Cited

U.S. PATENT DOCUMENTS 4,541,889 A * 9/1985 Held ........................ B27D 3/04
100/154
4,591,848 A    5/1986 Morozumi et al.
(Continued)

FOREIGN PATENT DOCUMENTS

EP    0 866 494 A1    9/1998
EP    1 092 739 A1    4/2001
(Continued)

OTHER PUBLICATIONS

International Search Report, Application No. PTC/JP2005/010313; PCT7927, Dated Sep. 6, 2005.
(Continued)

*Primary Examiner* — Moazzam Hossain
(74) *Attorney, Agent, or Firm* — Nixon Peabody LLP; Jeffrey L. Costellia

(57) ABSTRACT

It is an object of the invention to improve the production efficiency in sealing a thin film integrated circuit and to prevent the damage and break. Further, it is another object of the invention to prevent a thin film integrated circuit from being damaged in shipment and to make it easier to handle the thin film integrated circuit. The invention provides a laminating system in which rollers are used for supplying a substrate for sealing, receiving IC chips, separating, and sealing. The separation, sealing, and reception of a plurality of thin film integrated circuits can be carried out continuously by rotating the rollers; thus, the production efficiency
(Continued)

can be extremely improved. Further, the thin film integrated circuits can be easily sealed since a pair of rollers opposite to each other is used.

9 Claims, 13 Drawing Sheets

Related U.S. Application Data continuation of application No. 11/596,582, filed as application No. PCT/JP2005/010313 on May 31, 2005, now Pat. No. 8,123,896.

(51) Int. Cl.
  *B32B 37/20* (2006.01)
  *G06K 19/077* (2006.01)
  *H01L 21/683* (2006.01)
  *H01L 27/12* (2006.01)

(52) U.S. Cl.
  CPC . *G06K 19/07718* (2013.01); *G06K 19/07749* (2013.01); *H01L 21/67126* (2013.01); *H01L 21/67132* (2013.01); *H01L 21/67144* (2013.01); *H01L 21/6835* (2013.01); *H01L 27/1214* (2013.01); *H01L 27/1266* (2013.01); *B32B 2305/342* (2013.01); *B42D 2033/46* (2013.01); *H01L 2221/68318* (2013.01); *H01L 2221/68354* (2013.01); *H01L 2221/68363* (2013.01); *H01L 2924/0002* (2013.01); *Y10T 156/1089* (2015.01); *Y10T 156/1093* (2015.01); *Y10T 156/1712* (2015.01)

(58) Field of Classification Search
  USPC ......................................................... 438/127
  See application file for complete search history.

(56) References Cited

U.S. PATENT DOCUMENTS

| | | | |
|---|---|---|---|
| 4,743,334 A | 5/1988 | Singer | |
| 4,897,662 A | 1/1990 | Lee et al. | |
| 5,132,819 A | 7/1992 | Noriyama et al. | |
| 5,136,827 A | 8/1992 | Sawaya | |
| 5,203,941 A | 4/1993 | Spain et al. | |
| 5,258,320 A * | 11/1993 | Zavracky | A61B 3/113 |
| | | | 148/DIG. 135 |
| 5,274,602 A * | 12/1993 | Glenn | G06F 11/1008 |
| | | | 257/315 |
| 5,457,474 A | 10/1995 | Ikeda | |
| 5,461,338 A | 10/1995 | Hirayama et al. | |
| 5,477,073 A | 12/1995 | Wakai et al. | |
| 5,552,637 A | 9/1996 | Yamagata | |
| 5,644,147 A | 7/1997 | Yamazaki et al. | |
| 5,652,029 A | 7/1997 | Itoh | |
| 5,705,022 A * | 1/1998 | Lewis | B32B 37/06 |
| | | | 156/275.5 |
| 5,757,456 A | 5/1998 | Yamazaki et al. | |
| 5,766,696 A | 6/1998 | Itoh | |
| 5,807,772 A | 9/1998 | Takemura | |
| 5,814,834 A | 9/1998 | Yamazaki et al. | |
| 5,818,070 A | 10/1998 | Yamazaki et al. | |
| 5,821,137 A | 10/1998 | Wakai et al. | |
| 5,834,797 A | 11/1998 | Yamanaka | |
| 5,917,221 A | 6/1999 | Takemura | |
| 5,929,961 A | 7/1999 | Nishi et al. | |
| 5,956,011 A | 9/1999 | Koyama et al. | |
| 6,010,923 A | 1/2000 | Jinno | |
| 6,037,924 A | 3/2000 | Koyama et al. | |
| 6,072,193 A | 6/2000 | Ohnuma et al. | |
| 6,081,131 A | 6/2000 | Ishii | |
| 6,118,502 A | 9/2000 | Yamazaki et al. | |
| 6,150,283 A | 11/2000 | Ishiguro | |
| 6,153,893 A | 11/2000 | Inoue et al. | |
| 6,197,624 B1 | 3/2001 | Yamazaki | |
| 6,198,133 B1 | 3/2001 | Yamazaki et al. | |
| 6,204,519 B1 | 3/2001 | Yamazaki et al. | |
| 6,207,971 B1 | 3/2001 | Jinno et al. | |
| 6,224,965 B1 | 5/2001 | Haas et al. | |
| 6,285,248 B1 | 9/2001 | Hiratsuka | |
| 6,320,640 B2 * | 11/2001 | Nishi | B32B 37/06 |
| | | | 349/106 |
| 6,342,434 B1 | 1/2002 | Miyamoto et al. | |
| 6,342,717 B1 | 1/2002 | Komatsu | |
| 6,388,509 B2 | 5/2002 | Hiratsuka | |
| 6,392,628 B1 | 5/2002 | Yamazaki et al. | |
| 6,403,221 B1 | 6/2002 | Nakamura et al. | |
| 6,447,448 B1 | 9/2002 | Ishikawa et al. | |
| 6,462,723 B1 | 10/2002 | Yamazaki et al. | |
| 6,484,780 B2 * | 11/2002 | Ashley | B32B 37/0007 |
| | | | 156/230 |
| 6,512,271 B1 | 1/2003 | Yamazaki et al. | |
| 6,546,987 B1 * | 4/2003 | Tachibana | B29C 65/18 |
| | | | 156/555 |
| 6,569,716 B1 | 5/2003 | Suzuki | |
| 6,573,158 B2 | 6/2003 | Miyamoto et al. | |
| 6,589,855 B2 | 7/2003 | Miyamoto et al. | |
| 6,603,453 B2 | 8/2003 | Yamazaki et al. | |
| 6,608,613 B2 | 8/2003 | Koyama et al. | |
| 6,620,288 B2 | 9/2003 | Shinohara et al. | |
| 6,839,123 B2 | 1/2005 | Nishi et al. | |
| 6,842,396 B2 | 1/2005 | Kono | |
| 6,887,650 B2 | 5/2005 | Shimoda et al. | |
| 6,889,426 B2 * | 5/2005 | Fujii | H05K 3/0097 |
| | | | 156/184 |
| 6,922,134 B1 | 7/2005 | Yones | |
| 6,990,572 B2 | 1/2006 | Ando | |
| 7,015,080 B2 | 3/2006 | Ishikawa | |
| 7,037,752 B2 | 5/2006 | Kuwabara et al. | |
| 7,045,442 B2 | 5/2006 | Maruyama et al. | |
| 7,049,178 B2 | 5/2006 | Kim et al. | |
| 7,050,138 B1 | 5/2006 | Yamazaki et al. | |
| 7,060,153 B2 | 6/2006 | Yamazaki et al. | |
| 7,169,636 B2 | 1/2007 | Maruyama et al. | |
| 7,176,069 B2 | 2/2007 | Yamazaki et al. | |
| 7,271,076 B2 | 9/2007 | Yamazaki et al. | |
| 7,446,843 B2 | 11/2008 | Yamazaki et al. | |
| 7,485,489 B2 | 2/2009 | Björbell | |
| 7,566,633 B2 | 7/2009 | Koyama et al. | |
| 7,591,863 B2 * | 9/2009 | Watanabe | B32B 37/153 |
| | | | 257/E21.598 |
| 7,820,529 B2 | 10/2010 | Tsurume et al. | |
| 8,013,972 B2 | 9/2011 | Yamazaki et al. | |
| 8,123,896 B2 * | 2/2012 | Watanabe | B32B 37/20 |
| | | | 156/184 |
| 2001/0015256 A1 | 8/2001 | Yamazaki et al. | |
| 2001/0038308 A1 | 11/2001 | Hiratsuka | |
| 2002/0034860 A1 | 3/2002 | Miyamoto et al. | |
| 2002/0048907 A1 | 4/2002 | Miyamoto et al. | |
| 2003/0022403 A1 | 1/2003 | Shimoda et al. | |
| 2003/0082889 A1 * | 5/2003 | Maruyama | H01L 27/1214 |
| | | | 438/455 |
| 2003/0104659 A1 | 6/2003 | Arakawa et al. | |
| 2003/0162312 A1 | 8/2003 | Takayama et al. | |
| 2003/0188831 A1 | 10/2003 | Sasaki et al. | |
| 2003/0226638 A1 * | 12/2003 | Chen | B29C 63/02 |
| | | | 156/230 |
| 2004/0063256 A1 | 4/2004 | Ishikawa | |
| 2004/0129450 A1 | 7/2004 | Yamazaki et al. | |
| 2004/0129960 A1 | 7/2004 | Maruyama et al. | |
| 2004/0207011 A1 | 10/2004 | Iwata et al. | |
| 2004/0233374 A1 | 11/2004 | Yamazaki et al. | |
| 2004/0238827 A1 | 12/2004 | Takayama et al. | |
| 2004/0239827 A1 | 12/2004 | Yamazaki et al. | |
| 2005/0023530 A1 | 2/2005 | Koyama | |
| 2005/0051870 A1 | 3/2005 | Yamazaki et al. | |
| 2005/0056842 A1 | 3/2005 | Nishi et al. | |
| 2005/0070038 A1 | 3/2005 | Yamazaki et al. | |
| 2005/0081978 A1 * | 4/2005 | Britz | B29C 63/02 |
| | | | 156/64 |
| 2005/0090075 A1 | 4/2005 | Takayama et al. | |

(56) References Cited

U.S. PATENT DOCUMENTS

| | | |
|---|---|---|
| 2005/0105039 A1 | 5/2005 | Nishi et al. |
| 2005/0112805 A1 | 5/2005 | Goto et al. |
| 2005/0139823 A1 | 6/2005 | Hirakata et al. |
| 2005/0148121 A1 | 7/2005 | Yamazaki et al. |
| 2005/0158929 A1 | 7/2005 | Yamazaki et al. |
| 2005/0167573 A1 | 8/2005 | Maruyama et al. |
| 2005/0233122 A1 | 10/2005 | Nishimura et al. |
| 2005/0285231 A1 | 12/2005 | Arao et al. |
| 2005/0287846 A1 | 12/2005 | Dozen et al. |
| 2006/0189097 A1 | 8/2006 | Maruyama et al. |
| 2006/0202206 A1 | 9/2006 | Koyama et al. |
| 2006/0207714 A1 | 9/2006 | Yamazaki et al. |
| 2007/0098942 A1* | 5/2007 | Cote et al. .................. 428/40.1 |
| 2007/0173034 A1 | 7/2007 | Tsurume et al. |
| 2007/0259585 A1 | 11/2007 | Yamazaki et al. |
| 2008/0042168 A1 | 2/2008 | Watanabe et al. |
| 2008/0044940 A1 | 2/2008 | Watanabe et al. |
| 2008/0093464 A1 | 4/2008 | Dairiki et al. |
| 2008/0231354 A1 | 9/2008 | Koyama |
| 2009/0185130 A1 | 7/2009 | Yamazaki et al. |
| 2010/0317156 A1 | 12/2010 | Tsurume et al. |
| 2012/0113345 A1 | 5/2012 | Yamazaki et al. |

FOREIGN PATENT DOCUMENTS

| | | | | |
|---|---|---|---|---|
| EP | 1 435 653 A2 | 7/2004 | | |
| EP | 1 437 683 A2 | 7/2004 | | |
| EP | 1 455 394 A1 | 9/2004 | | |
| JP | 06-021443 | 1/1994 | | |
| JP | 07-074282 | 3/1995 | | |
| JP | 08-254686 | 10/1996 | | |
| JP | 10-092980 | 4/1998 | | |
| JP | 2000-252470 | 9/2000 | | |
| JP | 2001-272923 | 10/2001 | | |
| JP | 2001-277726 | 10/2001 | | |
| JP | 2002-041160 | 2/2002 | | |
| JP | 2002-083275 | 3/2002 | | |
| JP | 2003-016405 | 1/2003 | | |
| JP | 2003-016414 | 1/2003 | | |
| JP | 2003-086706 | 3/2003 | | |
| JP | 2003-203898 | 7/2003 | | |
| JP | 2003-324142 | 11/2003 | | |
| JP | 2004-094492 | 3/2004 | | |
| JP | 2004094492 A * | 3/2004 | ............ | B32B 37/06 |
| JP | 2004-118255 | 4/2004 | | |
| JP | 2004-221570 | 8/2004 | | |
| KR | 1997-0077741 | 12/1997 | | |
| WO | WO 99/26290 A1 | 5/1999 | | |
| WO | WO 01/01740 A1 | 1/2001 | | |
| WO | WO 04/001848 A1 | 12/2003 | | |
| WO | WO-2005/091370 A1 | 9/2005 | | |
| WO | WO 2005/119781 A1 | 12/2005 | | |

OTHER PUBLICATIONS

Written Opinion, Application No. PCT/JP2005/010313; PCT7927, Dated Sep. 6, 2005.

Office Action dated Jul. 9, 2009 (U.S. Appl. No. 11/596,582, filed Nov. 15, 2006).

Korean Office Action (Application No. PCT/KR2009/7000399) dated Sep. 8, 2009.

Chinese Office Action (Application No. 200910002857.6; PCTCN07927D1) Dated Mar. 3, 2011.

Supplementary European Search Report (Application No. 05745905.9;PCTEP07927) Dated Apr. 15, 2011.

* cited by examiner

LAMINATING SYSTEM

TECHNICAL FIELD

The present invention relates to a laminating system which seals a thin film integrated circuit. The invention further relates to an IC sheet including a plurality of thin film integrated circuits which are sealed. The invention still further relates to a roll of a plurality of thin film integrated circuits which are sealed and wound. Moreover, the invention relates to a method for manufacturing an IC chip in which a thin film integrated circuit is sealed.

BACKGROUND ART

In recent years, a technology of an IC chip using a thin film integrated circuit provided over a glass substrate (also referred to as IC tag, ID tag, RF (Radio Frequency) tag, wireless tag, or electronic tag) has been developed. In such technology, a thin film integrated circuit provided over a glass substrate is required to be separated from the glass substrate, which is a supporting substrate, after the completion. Accordingly, as a technology for separating a thin film integrated circuit which has been provided over a supporting substrate from the supporting substrate; for example, there is a technology in which a release layer containing silicon is provided between a thin film integrated circuit and a supporting substrate and the release layer is removed with the use of a gas containing a halogen fluoride thereby separating the thin film integrated circuit from the supporting substrate (Reference 1: Japanese Patent Laid-Open No. 8-254686).

A plurality of thin film integrated circuits are provided over a glass substrate, and the plurality of thin film integrated circuits are separated individually while the release layer is removed. However, the production efficiency is low in the case of sealing the separated thin film integrated circuits individually. Further, a thin film integrated circuit is thin and lightweight, so that it is difficult to seal the thin film integrated circuit without damage or break.

DISCLOSURE OF INVENTION

In view of the above problem, it is an object of the invention to improve the production efficiency in sealing a thin film integrated circuit and to prevent the damage and break.

Further, as described above, a thin film integrated circuit is broken very easily, and attention is required to handle it even after the sealing step, so that it has been very difficult to ship it without damage and break.

Correspondingly, it is another object of the invention to prevent a thin film integrated circuit from being damaged in shipment and to make the thin film integrated circuit easier to handle.

The invention provides a laminating system in which rollers are used for supplying a substrate for sealing, receiving IC chips, separating, and sealing. The separation, sealing, and reception of a plurality of thin film integrated circuits provided over a substrate can be carried out continuously by rotating the rollers; thus, the production efficiency can be extremely improved. Further, the thin film integrated circuits can be sealed easily since a pair of rollers opposite to each other is used.

A laminating system according to the invention comprises: a transfer means for transferring a first substrate provided with at least one thin film integrated circuit; a first supplying roller on which a second substrate winds; a peeling roller which separates the thin film integrated circuit from the first substrate by attaching a first surface of the thin film integrated circuit to the second substrate; a second supplying roller on which a third substrate to be attached to a second surface of the thin film integrated circuit winds; a laminating means which seals the thin film integrated circuit between the second substrate and the third substrate; and a receiving roller on which the sealed thin film integrated circuit winds, wherein the first surface and the second surface of the thin film integrated circuit are opposed to each other.

A laminating system according to the invention comprises: a first supplying roller on which a second substrate winds; a peeling roller which separates at least one thin film integrated circuit provided over a first substrate from the first substrate by attaching a first surface of the thin film integrated circuit to the second substrate; a second supplying roller on which a third substrate to be attached to a second surface of the thin film integrated circuit winds; a laminating means which seals the thin film integrated circuit between the second substrate and the third substrate; and a receiving roller on which the sealed thin film integrated circuit winds, wherein the first surface and the second surface of the thin film integrated circuit are opposed to each other.

A laminating system according to the invention comprises: a transfer means for transferring a first substrate provided with at least one thin film integrated circuit; a first supplying roller on which a second substrate winds; a second supplying roller on which a third substrate winds; a laminating means which separates the thin film integrated circuit from the first substrate by attaching a first surface of the thin film integrated circuit to the second substrate and seals the thin film integrated circuit between the second substrate and the third substrate; and a receiving roller on which the sealed thin film integrated circuit winds, wherein the first surface and the second surface of the thin film integrated circuit are opposed to each other.

A laminating system according to the invention comprises: a first substrate having a surface provided with at least one thin film integrated circuit; a first supplying roller on which a second substrate winds; a fixing/moving means (also referred to as a first substrate control means) which fixes the first substrate so that the surface of the first substrate and the second substrate are opposed to each other and moves the first substrate so that a first surface of the thin film integrated circuit is attached to the second substrate; a peeling means which separates the thin film integrated circuit from the surface of the first substrate by attaching the first surface of the thin film integrated circuit to the second substrate; a second supplying roller on which a surface of a third substrate to be attached to a second surface of the thin film integrated circuit winds; a laminating means which seals the thin film integrated circuit between the second substrate and the third substrate; and a receiving roller on which the sealed thin film integrated circuit winds, wherein the first surface and the second surface of the thin film integrated circuit are opposed to each other.

In a laminating system having any one of the above structures the laminating means comprises a first roller and a second roller which are opposed to each other. At least one of the first roller and the second roller has a heating means. The laminating means seals the thin film integrated circuit by performing at least one of a pressure treatment and a heat treatment while the thin film integrated circuit passes between the first roller and the second roller which are opposed to each other.

Further, the second substrate and the third substrate comprise laminate films. The surface of the second substrate comprises an adhesive surface. The surface of the third substrate comprises an adhesive surface.

Still further, the invention provides an IC sheet which comprises at least one sealed thin film integrated circuit that is made to have a sheet like shape to be handled easily. An IC sheet according to the invention has a plurality of thin film integrated circuits sealed between a second substrate and a third substrate.

Moreover, the invention provides a roll which comprises at least one sealed thin film integrated circuit that is wound to be handled easily. A roll according to the invention comprises a plurality of thin film integrated circuits which are sealed between a second substrate and a third substrate which are wound.

As to an IC sheet or a roll comprising the above structure, the plurality of thin film integrated circuits each has a thin film transistor and a conductive film which serve as an antenna. The plurality of thin film integrated circuits are arranged regularly. Further, the second substrate and the third substrate comprise laminate films.

A method for manufacturing an IC chip according to the invention comprises the steps of: forming a release layer over a first substrate having an insulating surface, forming at least one of thin film integrated circuit over the first substrate, forming an opening at a boundary of the thin film integrated circuit to expose a part of the release layer, introducing a gas or a liquid containing a halogen fluoride into the opening to remove the release layer, attaching a first surface of the thin film integrated circuit to the second substrate to separate the thin film integrated circuit from the first substrate, attaching a second surface of the thin film integrated circuit to the third substrate, so that the thin film integrated circuit is sealed between the second substrate and the third substrate, wherein the first surface and the second surface of the thin film integrated circuit are opposed to each other.

In a laminating system according to the present invention in which a roller for supplying a substrate for sealing, a roller for winding thin film integrated circuits, rollers for separating and sealing the thin film integrated circuits, the separation, sealing, and reception of the plurality of thin film integrated circuits provided over a substrate can be carried out continuously; thus, the production efficiency can be improved and the manufacturing time can be reduced.

Further, a laminating system according to the invention which seals thin film integrated circuits using a pair of rollers which is opposite to each other as laminating means (also referred to as sealing means) can easily seal the thin film integrated circuits.

As to an IC sheet and a roll according to the invention, since thin film integrated circuits have already been sealed; thus, they can be easily handled and the thin film integrated circuits are prevented from being damaged and broken. Further, a great amount of thin film integrated circuits can be easily shipped.

BEST MODE FOR CARRYING OUT THE INVENTION

Figure 1:
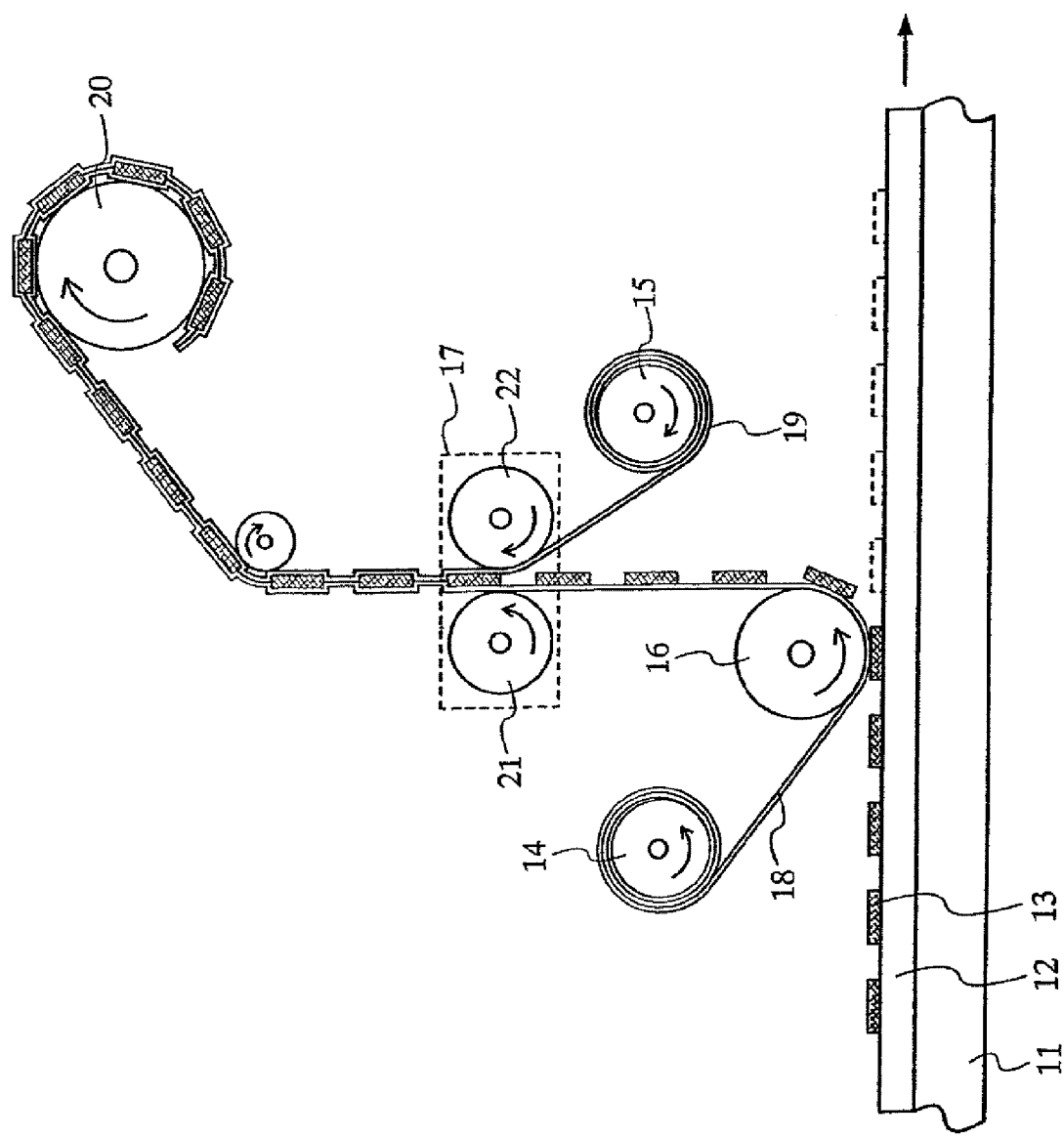
FIG. 1 is a figure showing a laminating system according to the invention.

Embodiment modes and Embodiments of the invention will be described in detail with reference to the drawings. However, it is easily understood by those skilled in the art that the invention is not limited by the following descriptions and various changes may be made in forms and details without departing from the spirit and the scope of the invention. Therefore, the invention should not be limited by descriptions of Embodiment Modes and Embodiments below. The same reference numerals are commonly given to the same components in the construction of the invention, which will be described below.

Embodiment Mode 1

The invention provides a laminating system in which rollers are used for supplying a substrate for sealing, receiving IC chips, separating, and sealing. Major modes of the laminating system will be described with reference to the drawings.

A laminating system according to the invention comprises: a transfer means 11 for transferring a first substrate 12 provided with a plurality of thin film integrated circuits 13, a first supplying roller 14 on which a second substrate 18 winds, a peeling roller 16 which separates the thin film integrated circuits 13 from the first substrate 12, a second supplying roller 15 on which a third substrate 19 winds, a laminating means 17 which seals the thin film integrated circuits 13 between the second substrate 18 and the third substrate 19, and a receiving roller 20 on which the sealed thin film integrated circuits 13 wind (FIG. 1).

In an apparatus shown in FIG. 1, thin film integrated circuits 13 over the first substrate 12 which is transferred by a transfer means 11 is attached to the second substrate 18 which has traveled from the first supplying roller 14 toward the peeling roller 16 to separate the thin film integrated circuits 13 from the first substrate 12. The second substrate 18 to which the thin film integrated circuits 13 are attached travels in the direction of the laminating means 17. The third substrate 19 travels from the second supplying roller 15 toward the laminating means 17. At the laminating means 17, either or both of a pressure treatment and a heat treatment are carried out while the thin film integrated circuits 13 are attached to the third substrate 19. Finally, the thin film integrated circuits 13 which are sealed between the second substrate 18 and the third substrate 19 travel in the direction of the receiving roller 20 to be wound on the receiving roller 20.

In accordance with the above operations, in a laminating system according to the invention, the peeling roller 16, the laminating means 17, and the receiving roller 20 are provided so that the thin film integrated circuits 13 which is attached to the second substrate 18 and the third substrate 19 pass them in order. The peeling roller 16 and the receiving roller 20 rotate in directions different from each other. The first supplying roller 14, the peeling roller 16, and a roller 21 included in the laminating means 17 are provided so that the second substrate 18 pass them in order. Further, the first supplying roller 14, the peeling roller 16, and the roller 21 rotate in the same direction. The second supplying roller 15 and a roller 22 included in the laminating means 17 are provided so that the third substrate 19 pass them in order. The second supplying roller 15 and the roller 22 rotate in the same direction.

The transfer means 11 is for transferring the first substrate 12 provided with a plurality of thin film integrated circuits 13. For example, the transfer means comprises a conveyer belt, a plurality of rollers, and a robot arm. A robot arm transfers the first substrate 12 itself or transfers a stage provided with the first substrate 12. The transfer means 11 transfers the first substrate 12 at a predetermined speed in accordance with a speed at which the first supplying roller 14 rotates.

The second substrate 18 is wound on the first supplying roller 14, and the third substrate 19 is wound on the second supplying roller 15. The second substrate 18 is made travel toward the peeling roller 16 by rotating the first supplying roller 14 at a predetermined speed. The third substrate 19 is made travel toward the laminating means 17 by rotating the second supplying roller 15 at a predetermined speed. The first supplying roller 14 and the second supplying roller 15 have circular cylinder shape and are formed from a resin material, a metal material, or the like.

The second substrate 18 and the third substrate 19 each correspond to a laminate film, a paper made of a fibrous material, or the like. A laminate film may be made of a material such as polypropylene, polyester, vinyl, polyvinyl fluoride, polyvinyl chloride and the surface may be processed, for example, embossed.

The laminate film corresponding to the second substrate 18 and the third substrate 19 may be made of a material such as polyethylene and ethylene vinyl acetate. The surface may be coated with powders of silicon dioxide (silica). The coating keeps water resistance even under an atmosphere of high temperature and high humidity.

Either or both of a surface of the second substrate 18 and the third substrate 19 may have adhesive surfaces. The adhesive surface is coated with an adhesive such as a thermosetting resin, an ultraviolet curable resin, an epoxy based adhesive, or a resin additive.

Either or both of the second substrate 18 and the third substrate 19 may have light-transmitting properties. Further, either or both of the second substrate 18 and the third substrate 19 may be coated with a conductive material on the surfaces to protect the thin film integrated circuit to be sealed by charging static electricity in either or both of the second substrate 18 and the third substrate 19.

Either or both of the second substrate 18 and the third substrate 19 may be coated with a conductive material such as a thin film containing carbon as a main component (a diamond-like carbon film) or indium tin oxide (ITO) as a protective film.

The peeling roller 16 is provided to attach a first surface of the thin film integrated circuits 13 to a surface of the second substrate 18 in order to separate the thin film integrated circuits 13 from the first substrate 12. When the peeling roller 16 rotates, the thin film integrated circuits 13 is attached to the second substrate 18; thus, the thin film integrated circuits 13 are separated from the first substrate 12. Consequently, the peeling roller 16 is opposed to the side of the first substrate 12 where the thin film integrated circuits 13 are provided.

According to the above structure, the first substrate 12 is moved by the transfer means 11, and the peeling roller 16 is fixed; however, the invention is not limited thereto. The first substrate 12 may be fixed, and the peeling roller 16 may be moved so that the thin film integrated circuits 13 are separated from the first substrate 12. The peeling roller 16 has a circular cylinder shape and is formed from a resin material, a metal material, or the like. Preferably, the peeling roller 16 is formed of a soft material.

When the thin film integrated circuits 13 comprising a first surface which is attached to the second substrate 18 reach the laminating means 17, the laminating means 17 seals the thin film integrated circuits 13 between the second substrate 18 and the third substrate 19 while making the third substrate 19 attach to a second surface of the thin film integrated circuits 13.

The laminating means 17 comprises the roller 21 and the roller 22 which are opposed to each other. A second surface of the thin film integrated circuits 13 are attached to the third substrate 19 traveling from the second supplying roller 15 toward the roller 22, and either or both of a pressure treatment and a heat treatment are performed using the roller 21 and the roller 22 while the third substrate 19 passes between the roller 21 and the roller 22. Through the above steps, the thin film integrated circuits 13 are sealed between the second substrate 18 and the third substrate 19.

Either or both of the rollers 21 and 22 constituting the laminating means 17 include heating means. The heating means, for example, corresponds to a heating medium such as a heating wire or oil. In the case where a heat treatment is not carried out by the rollers 21 and 22, the rollers 21 and 22 may not necessarily have a heating means.

The rollers 21 and 22 rotate at a predetermined speed in accordance with the speed at which the peeling roller 16 and the second supplying roller 15 rotate. The rollers 21 and 22 have circular cylinder shape, and are formed from a resin material, a metal material, or the like, preferably, from a soft material.

The receiving roller 20 is a roller which receives the thin film integrated circuits 13 which are sealed by the second substrate 18 and the third substrate 19 by winding them. The receiving roller 20 rotates at a predetermined speed in accordance with the speed at which the rollers 21 and 22 rotate. The receiving roller 20 have circular cylinder shape, and are formed from a resin material, a metal material, or the like, preferably, from a soft material.

Using a system according to the invention, the first supplying roller 14, the second supplying roller 15, the peeling roller 16, the rollers 21 and 22, and the receiving roller 20 rotate; thus, the plurality of thin film integrated circuits 13 over the first substrate 12 can be peeled, sealed, and received in sequence. Therefore, a system according to the invention can provide high productivity and manufacturing efficiency.

Next, a laminating system having a structure different from the above laminating system will be described with reference to FIG. 2.

Figure 2:
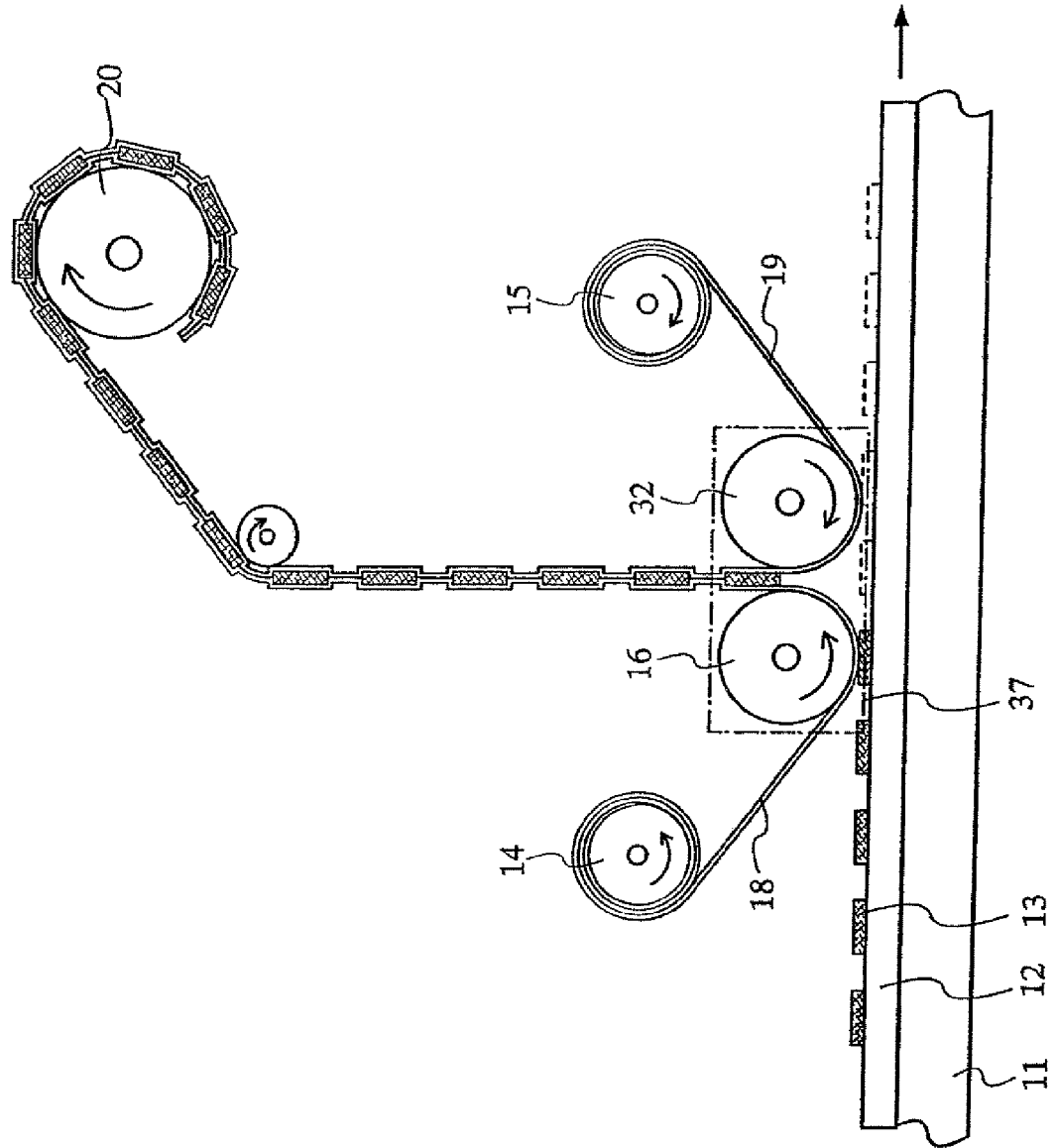
FIG. 2 is a figure showing a laminating system according to the invention.

A laminating system according to the invention includes a transfer means 11 for transferring a first substrate 12 provided with a plurality of thin film integrated circuits 13, a first supplying roller 14 on which a second substrate 18 winds, a second supplying roller 15 on which a third substrate 19 winds, a laminating means 17 which separates the thin film integrated circuits 13 from the first substrate 12 and seals the thin film integrated circuits 13 with the second substrate 18 and the third substrate 19, and a receiving roller 20 on which the plurality of sealed thin film integrated circuits 13 wind (FIG. 2)

Such a structure has a feature that a roller 32 which is opposed to the peeling roller 16 is provided and a laminating means 37 is constituted by the peeling roller 16 and the roller 32. In other words, the peeling roller 16 also serves as a laminating means 37. Either or both of the peeling roller 16 and the roller 32 have heating means.

In a system shown in FIG. 2, a first surface of the thin film integrated circuits 13 is attached to the second substrate 18 by the peeling roller 16 to separate the thin film integrated circuits 13 from the first substrate 12 while a second surface of the thin film integrated circuits 13 is attached to the third substrate 19 by the roller 32. Further, while the thin film integrated circuits 13 passes between the peeling roller 16 and the roller 32, the thin film integrated circuits 13 are sealed between the second substrate 18 and the third substrate 19 by performing either or both of a pressure treatment and a heat treatment.

Accordingly, in the laminating system according to the invention, the laminating means 37 including the peeling roller 16, and the receiving roller 20 are provided so that the thin film integrated circuits 13 which are attached to the second substrate 18 and the third substrate 19 pass them in order. The peeling roller 16 and the receiving roller 20 rotate in different directions from each other. The first supplying roller 14 and the peeling roller 16 included in the laminating means 37 are provided so that the second substrate 18 passes them in order. The first supplying roller 14 and the peeling roller 16 rotate in the same direction. The second supplying roller 15 and the roller 32 included in the laminating means 37 are provided so that the third substrate 19 passes them in order. The second supplying roller 15 and the roller 32 rotate in the same direction.

Using a system according to the invention, the first supplying roller 14, the second supplying roller 15, the peeling roller 16, the roller 32, and the receiving roller 20 rotate; thus, the plurality of thin film integrated circuits 13 over the first substrate 12 can be peeled, sealed, and received in sequence. Therefore, a system according to the invention can provide high productivity and manufacturing efficiency.

Next, a laminating system having a structure different from the above laminating system will be described with reference to FIG. 3.

Figure 3:
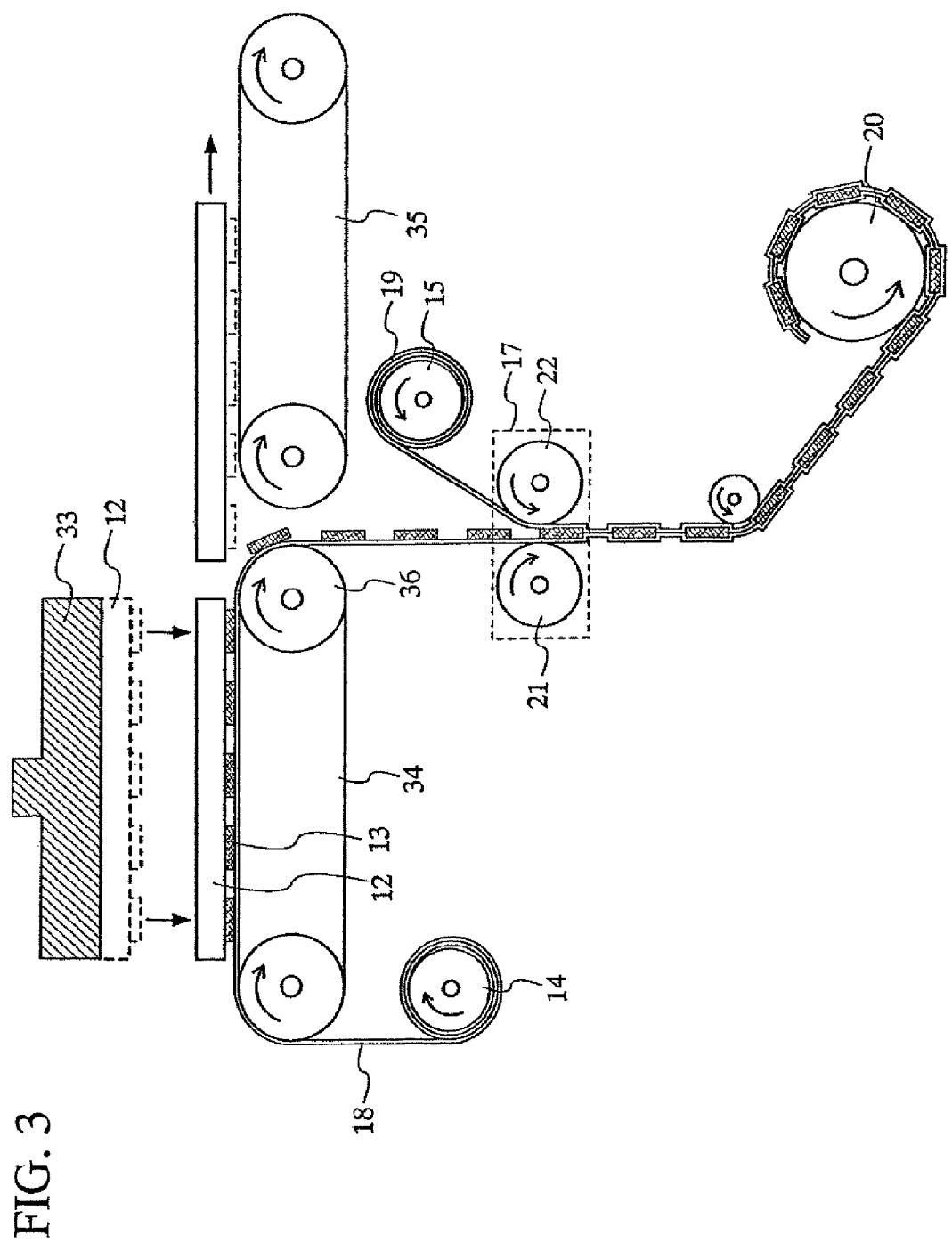
FIG. 3 is a figure showing a laminating system according to the invention.

A laminating system according to the invention includes a fixing/moving means (also referred to as a first substrate control means) 33 which fixes and moves the first substrate 12, a peeling means 36 which separates the thin film integrated circuits 13 from a surface of the first substrate 12, a first supplying roller 14 on which a second substrate 18 winds, a second supplying roller 15 on which a third substrate 19 winds, a laminating means 17 which seals the thin film integrated circuits 13 with the second substrate 18 and the third substrate 19, and a receiving roller 20 on which the sealed thin film integrated circuits 13 wind (FIG. 3). Further, transfer means 34 and 35 are included in addition to the above components. The structure shown in FIG. 3 has an upside-down structure of the structure shown in FIG. 1 and is newly provided with a fixing/moving means 33 and the transfer means 34 and 35.

In this system, the thin film integrated circuits 13 over the first substrate 12 moved by the fixing/moving means 33 are attached to the second substrate 18 which has traveled from the first supplying roller 14 toward the transfer means 34. The thin film integrated circuits 13 are separated from the first substrate 12 by the peeling means 36 included in the transfer means 34. Further, the second substrate 18, to which the thin film integrated circuits 13 are attached, travels toward the laminating means 17. The third substrate 19 travels from the second supplying roller 15 toward the laminating means 17. At the laminating means 17, either or both of a pressure treatment and a heat treatment are performed while the thin film integrated circuits 13 are attached to the third substrate 19. Finally, the thin film integrated circuits 13 which are sealed between the second substrate 18 and the third substrate 19 travel toward the receiving roller 20 to wind on the receiving roller 20.

Accordingly, in the laminating system according to the invention, the peeling means 36, the roller 21 included in the laminating means 17, the receiving roller 20 are provided so that the thin film integrated circuits 13 attached to the second substrate 18 and the third substrate 19 pass them in order. The peeling means 36 and the receiving roller 20 rotate in different directions from each other. The first supplying roller 14, the transfer means 34, and the roller 21 included in the laminating means 17 are provided so that the second substrate 18 passes them in order. The first supplying roller 14 and the roller 21 rotate in the same direction. The second supplying roller 15 and the roller 22 included in the laminating means 17 are provided so that the third substrate 19 pass them in order. The second supplying roller 15 and the roller 22 rotate in the same direction.

The fixing/moving means 33 has a function of fixing the first substrate 20 so that a surface of the first substrate 12 where the thin film integrated circuits 13 are provided (hereinafter referred to as a first surface of the first substrate 12) is opposed to the second substrate 18 and a function of moving the first substrate 12 so that the thin film integrated circuits 13 over the first surface of the first substrate 12 are attached to the second substrate 18. The first substrate 12 is moved by a vacuum adsorption method or the like. The first substrate 12 is moved by moving the fixing/moving means 33.

The fixing/moving means 33 may be one which processes the first substrate 12 one by one as shown in the figure, and may have a shape of a polyhedron such as a circular cylinder or a prism. In the case of using one with the shape of a circular cylinder or a prism, the first substrate 12 is fixed to the side surface thereof, and the first substrate 12 is moved by rotating the circular cylinder or a prism.

The transfer means 34 transfers the second substrate 18 and the first substrate 12 provided with the plurality of thin film integrated circuits 13. The peeling means 36 disposed on an end of the transfer means 34 attaches the first surface of the thin film integrated circuits 13 to the second substrate 18 to separate the thin film integrated circuits 13 from the first surface of the first substrate 12. In the structure shown in the figure, the peeling means 36 corresponds to a roller. The transfer means 35 transfers the first substrate 12 from which the thin film integrated circuits 13 are peeled.

After the thin film integrated circuits 13 are separated from the first substrate 12, the third substrate 19 is attached to a second surface of the thin film integrated circuits 13 which is opposed to the first surface of the thin film integrated circuits by the laminating means 17 while the thin film integrated circuits 13 are sealed between the second substrate 18 and the third substrate 19 as with the structure of the laminating system in FIG. 1. Subsequently, the thin film integrated circuits 13 are received by the receiving roller 20.

Using a system according to the invention, the transfer means 34 and 35, the first supplying roller 14, the second supplying roller 15, the rollers 21 and 22, and the receiving roller 20 rotate; thus, the plurality of thin film integrated circuits 13 over the first substrate 12 can be peeled, sealed, and received in sequence. Therefore, a system according to the invention can provide high productivity and manufacturing efficiency.

Figure 4:
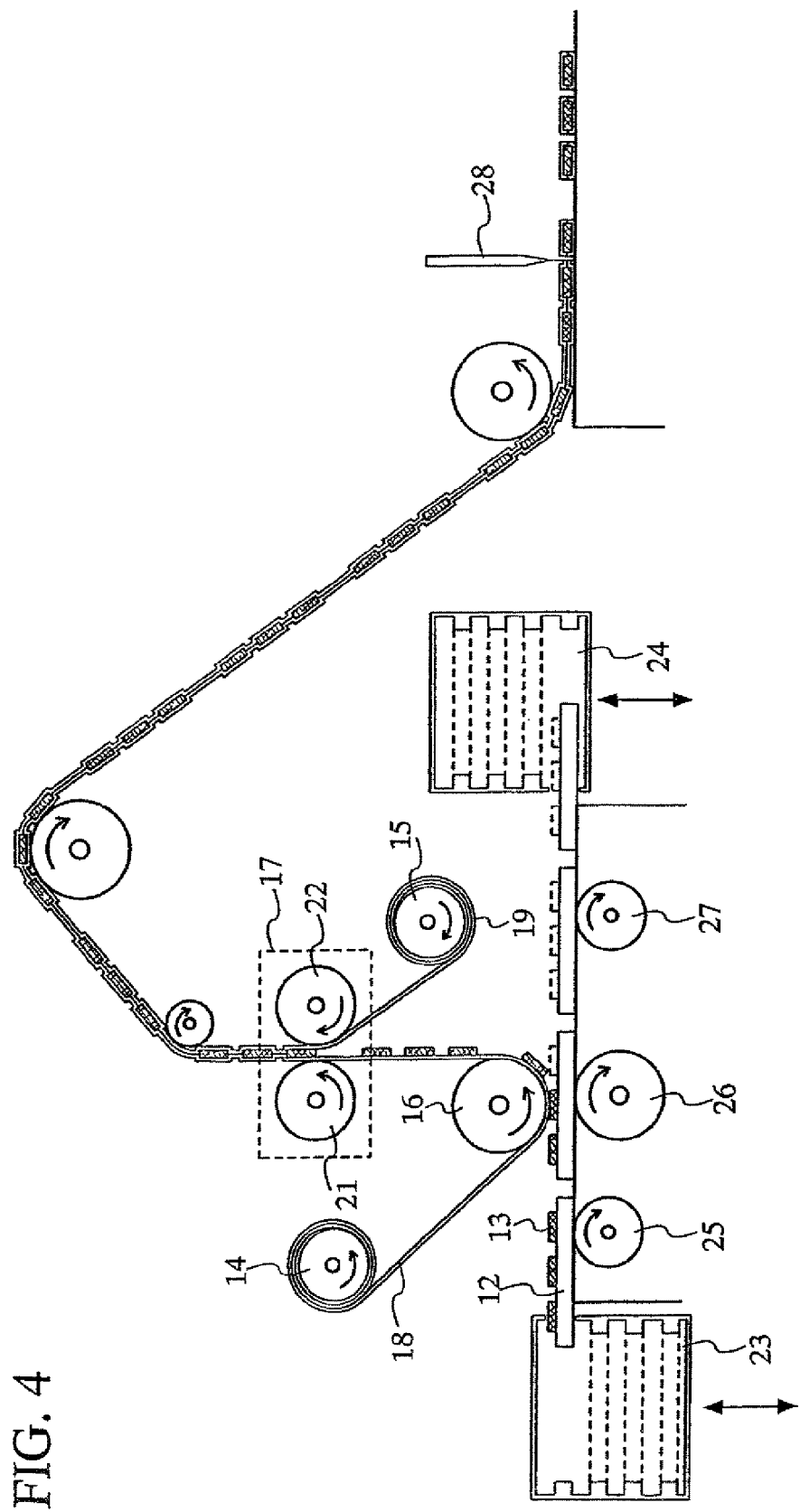
FIG. 4 is a figure showing a laminating system according to the invention.

Next, a general structure of a laminating system will be described with reference to FIG. 4. Here, a general structure of a laminating system having a structure shown in FIG. 1 will be described.

A cassette 23 is a cassette for supplying a substrate, and a first substrate 12 provided with a plurality of thin film integrated circuits 13 are set therein. A cassette 24 is a cassette for receiving a substrate, and the first substrate 12 is to be set therein. A plurality of rollers 25 to 27 are provided as transfer means between the cassette 23 and the cassette 24. The first substrate 12 is transferred when the rollers 25 to 27 rotate. Thereafter, the thin film integrated circuits 13 are peeled and sealed, and the sealed thin film integrated circuits 13 are cut by a cutting means 28. The cutting means 28 may use a dicing system, a scribing system, a laser irradiation apparatus (particularly, a $CO_2$ laser irradiation apparatus) or the like. The sealed thin film integrated circuits 13 are completed through the above steps.

In the structures shown in FIGS. 1 to 4, the thin film integrated circuits 13 provide over the first substrate 12 include an element group of a plurality of elements and a conductive layer serving as an antenna. However, the invention is not limited thereto.

The thin film integrated circuits 13 provided over the first substrate 12 may only include an element group. A conductive layer serving as an antenna is attached to the second substrate 18 or the third substrate 19, and a plurality of elements included in the thin film integrated circuits 13 may be connected to the conductive layer in attaching the thin film integrated circuits 13 to the second substrate 18 or the third substrate 19.

Embodiment Mode 2

Figure 13:
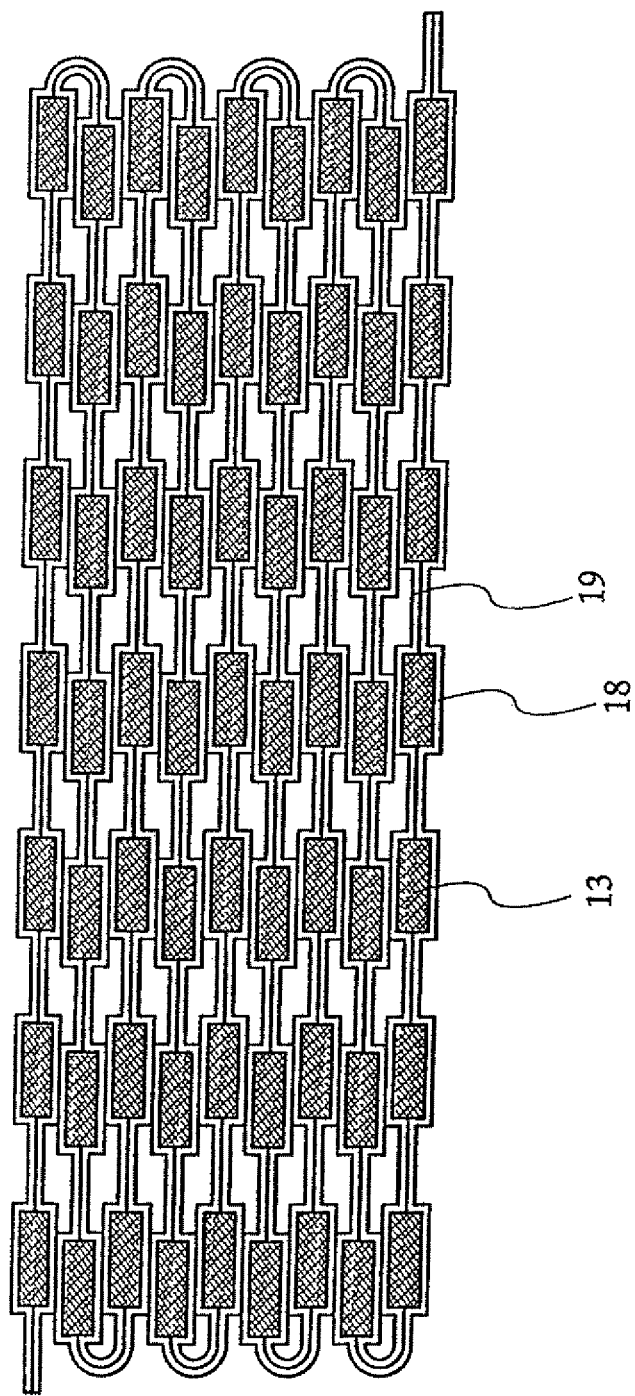
FIG. 13 is a figure showing an IC sheet according to the invention.

A structure of an IC sheet (also referred to as an IC film, a sheet element, and a film element) according to the invention will be described. An IC sheet according to the invention is a second substrate 18 and a third substrate 19 which are attached to each of a plurality of thin film integrated circuits 13 from both surfaces which are wound in a roller shape (see cross-sectional view of an IC sheet in FIG. 13). Each of the plurality of thin film integrated circuits 13 has a plurality of elements and a conductive layer serving as an antenna. Each of the plurality of thin film integrated circuits 13 are arranged regularly.

As described above, sheet-like IC sheets comprising a plurality of thin film integrated circuits 13 sealed with a pair of substrates for sealing are easy to be shipped. In particular, it is advantageous in the shipment of a large amount of thin film integrated circuits 13. Further, the plurality of thin film integrated circuits 13 are difficult to be handled when each of them are divided; however, an IC sheet provided by the invention has a sheet shape, so that it is easy to handle and the break and damage of the thin film integrated circuits 13 can be prevented.

Embodiment Mode 3

Figures 12A, 12B:
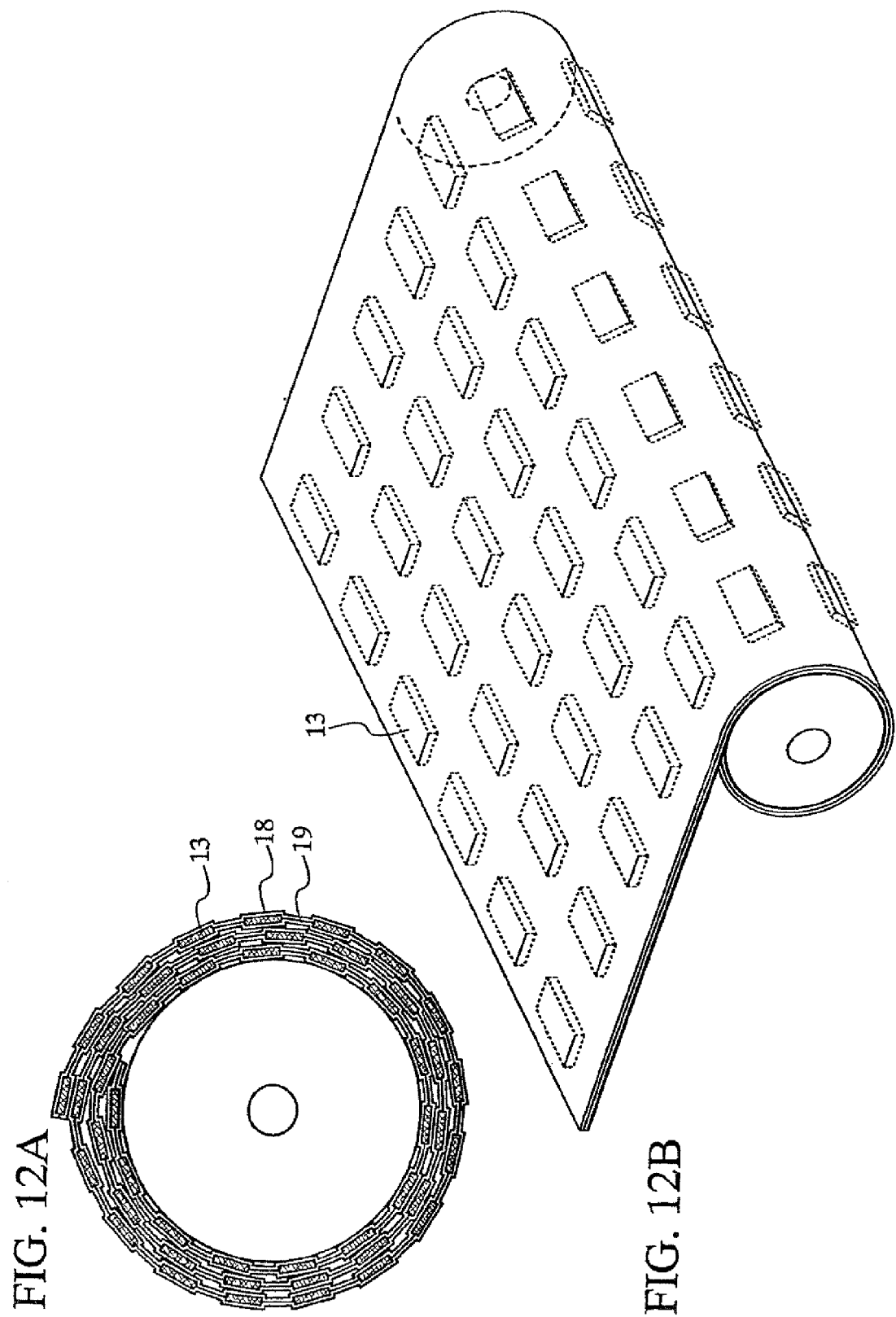
FIGS. 12A and 12B are figures showing a roll according to the invention.

A structure of a roll (also referred to as wound element, roll body or the like) according to the invention will be described. A roll according to the invention winds a substrate, more specifically, a second substrate 18 and a third substrate 19 which seal each of a plurality of thin film integrated circuits 13 are wound in a roll shape (see a cross-sectional view of a roll in FIG. 12A and a perspective view of a roll in FIG. 12B). Each of the plurality of thin film integrated circuits 13 has a plurality of elements and a conductive film as an antenna. The plurality of thin film integrated circuits 13 are arranged regularly.

As described above, a roll which is a plurality of thin film integrated circuits 13 sealed with a pair of substrates are wound can easily be shipped. In particular, it is advantageous in the shipment of a large amount of thin film integrated circuits 13. Further, the plurality of thin film integrated circuits 13 are difficult to be handled when each of them are divided; however, a roll provided by the invention is wound, so that it is easy to handle and the break and damage of the thin film integrated circuits 13 can be prevented.

Embodiment Mode 4

A method for manufacturing an IC chip according to the invention will be described with reference to the drawings.

Figure 5A:
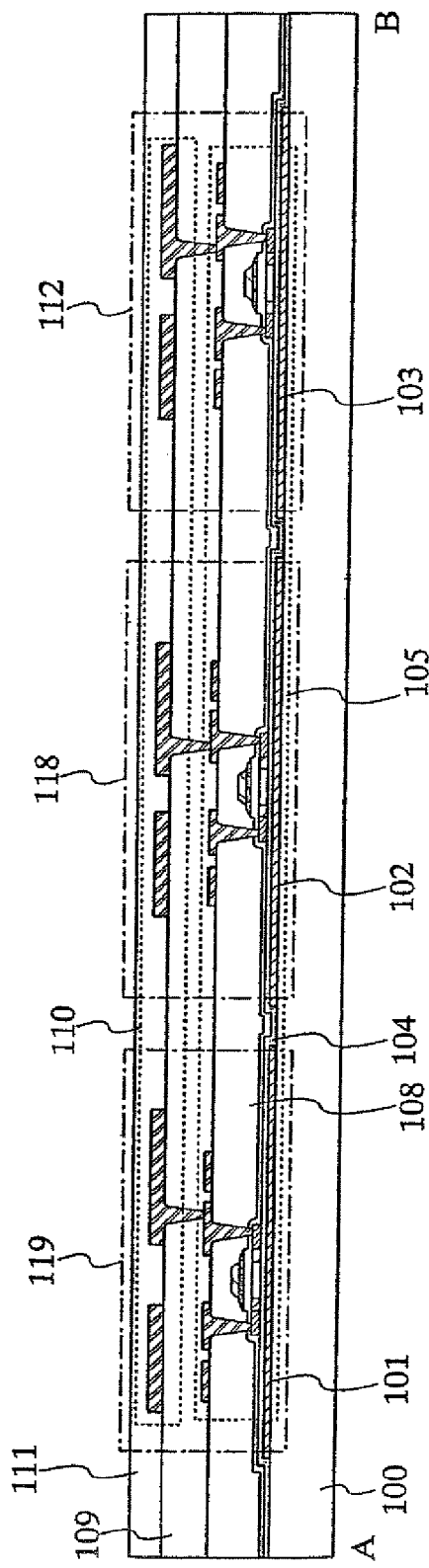
FIGS. 5A and 5B are figures showing a method for manufacturing an IC chip.

First, release layers 101 to 103 are formed over a first substrate 100 having an insulating surface (FIG. 5A). The first substrate 100 having an insulating surface corresponds to a glass substrate, a quartz substrate, a plastic substrate, a resin substrate formed of a flexible synthetic resin such as acrylic, a metal substrate, or a silicon substrate. Note that in the case where a silicon substrate is used, a release layer is not required to be provided.

The release layers 101 to 103 are layers containing silicon which are formed by sputtering, plasma CVD, or the like. A layer containing silicon corresponds to an amorphous semiconductor layer, a semiamorphous semiconductor layer in which an amorphous state and a crystalline state are mixed, or a crystalline semiconductor layer.

The release layers 101 to 103 are each formed of a layer of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), and silicon (Si), an alloy material or a compound material containing the element as a main component, which is formed by a known method (such as sputtering or plasma CVD). The release layers each may have a single layer structure or a layered structure.

Figure 5B:
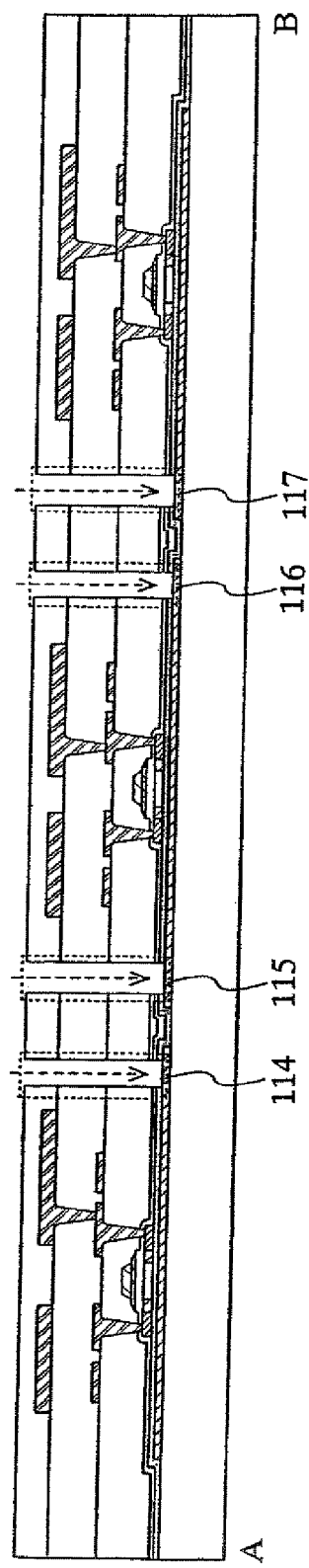
Figure 8:
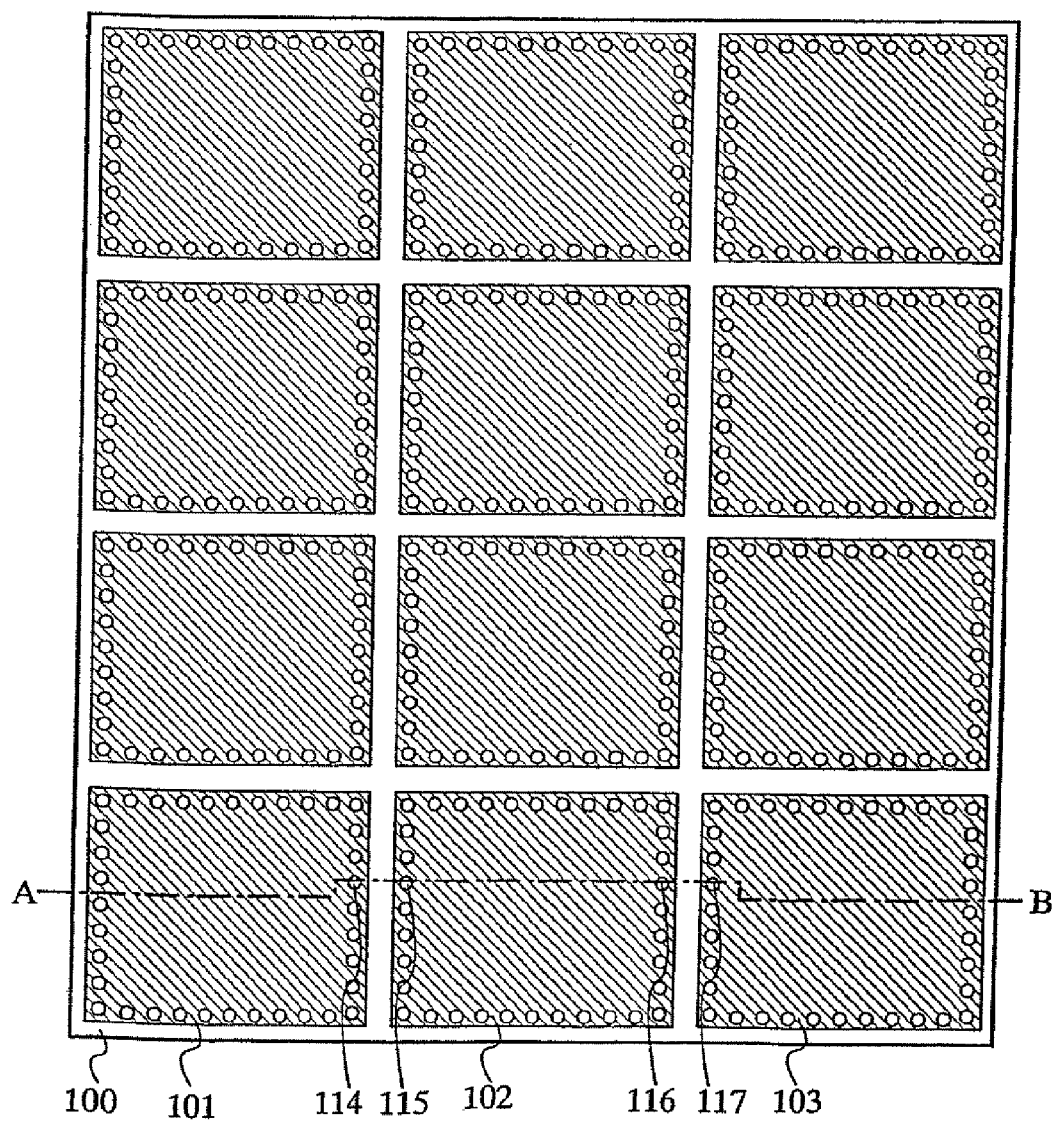
FIG. 8 is a figure showing a method for manufacturing an IC chip.

The release layers 101 to 103 are formed selectively over the first substrate 100. A top view thereof is shown in FIG. 8. FIGS. 5A and 5B each show a cross-sectional view taken along line A-B in FIG. 8. Such selective formation is carried out in order to prevent dispersion of a plurality of thin film integrated circuits 112, 118, and 119 provided over the release layers 101 to 103 after removing the release layers 101 to 103.

Next, a base insulating film 104 is formed over the release layer 101 to 103. Subsequently, an element group 105 is formed over the insulating layer 104. The element group 105 includes a thin film transistor, a capacitor, a resistor, a diode or a plurality of the respective elements. Next, an insulating film 108 is formed to cover the element group 105 and an insulating film 109 is formed over the insulating film 108. A conductive layer 110 serving as an antenna is formed over the insulating film 109. Further, an insulating film 111 serving as a protective film is formed over the conductive layer 110. Through the above steps, the thin film integrated circuits 112, 118, and 119 comprising the element group 105 and the conductive layer 110 are completed.

The insulating films 108, 109, and 111 are formed from an organic material or an inorganic material. Polyimide, acrylic, polyamide, siloxane, epoxy, or the like can be used as an organic material. Siloxane includes a skeleton formed from a bond of silicon (Si) and oxygen (O), and an organic group containing hydrogen (for example, an alkyl group or an aromatic hydrocarbon), a fluoro group or an organic group containing hydrogen and a fluoro group is used for a substituent. Silicon oxide, silicon nitride, silicon oxynitride, silicon nitride oxide, or the like is used for an inorganic material.

In stead of selectively forming the release layers 101 to 103, the insulating film 111 may have thick thickness for preventing the thin film integrated circuits 112, 118, and 119 from scattering. When the thickness of the insulating film 111 is thicker than normal, the thin film integrated circuits 112, 118, and 119 can be prevented from scattering, owing to the weight of the insulating film 111.

Next, openings 114 to 117 are respectively formed between the thin film integrated circuits 112, 118, and 119 so as to expose the release layers 101 to 103 (FIG. 5B). The openings 114 to 117 are formed by etching using a mask, dicing or the like.

Figure 6A:
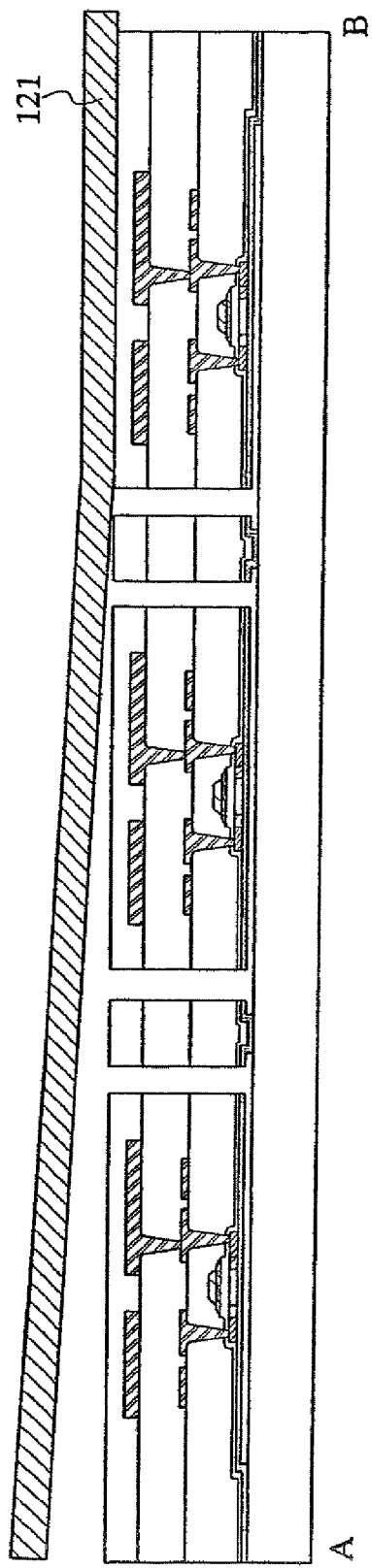
FIGS. 6A and 6B are figures showing a method for manufacturing an IC chip.

Subsequently, an etchant for removing the release layers 101 to 103 is introduced into the openings 114 to 117 to make them gradually recede, thereby removing the release layers 101 to 103 (FIG. 6A). A gas or a liquid containing halogen fluoride is used as the etchant. For example, chlorine trifluoride ($ClF_3$) is used as a halogen fluoride.

Alternatively, nitrogen trifluoride ($NF_3$), bromine trifluoride ($BrF_3$), or hydrogen fluoride (HF) may be used as a halogen fluoride. Note that hydrogen fluoride is used in the case of forming a layer containing silicon as a release layer.

Further, as described above, since the release layers 101 to 103 are selectively formed here; thus, a part of the insulating film 104 is in contact with the first substrate 100 after removing the release layers 101 to 103. Therefore, the thin film integrated circuits 112, 118, and 119 can be prevented from scattering.

Next, a first surface of each of the thin film integrated circuit 112, 118, and 119 is attached to a second substrate 121. Correspondingly, the thin film integrated circuits 112, 118, and 119 are separated from the first substrate 100.

In the above steps, a part of the insulating film 104 remains over the first substrate 100; however, the invention is not limited thereto. In the case where the adhesion between the first substrate 100 and the insulating film 104 is low, the insulating film 104 would completely separated from the first substrate 100 by carrying out the above steps.

Figure 6B:
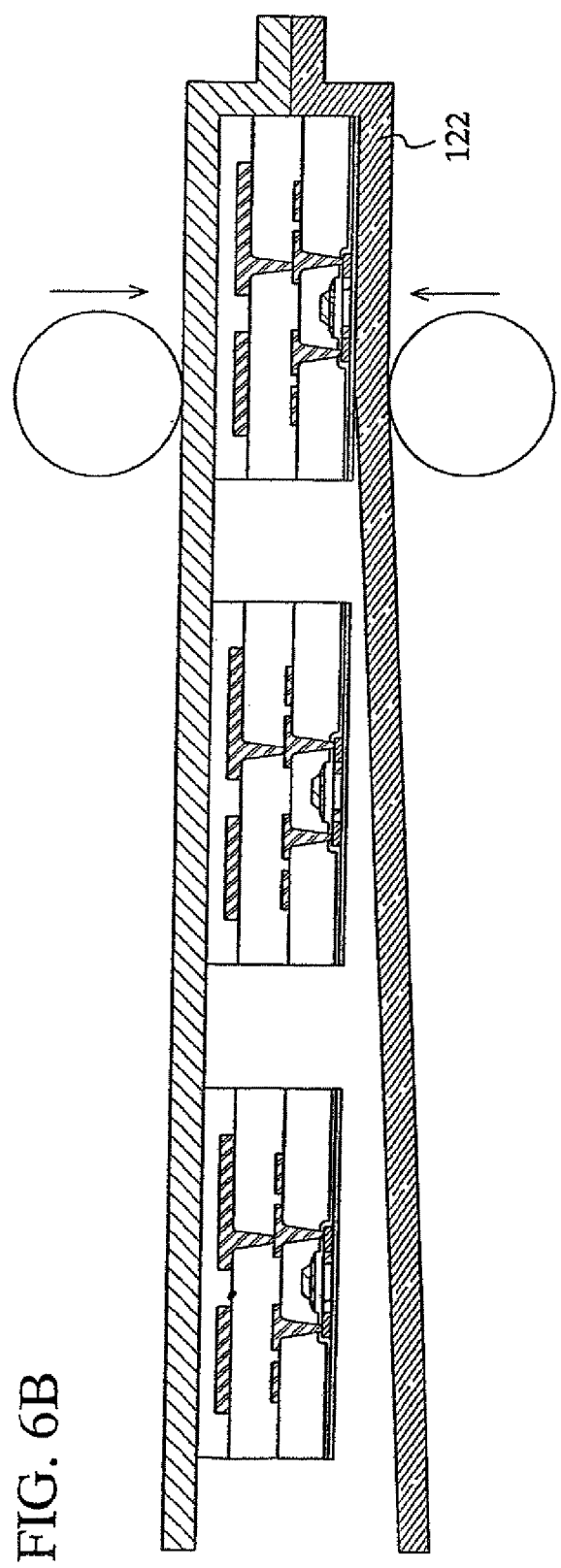

Next, a second surface of the thin film integrated circuits 112, 118, and 119 are attached to a third substrate 122 and the thin film integrated circuits 112, 118, and 119 are sealed between the second substrate 121 and the third substrate 122 (FIG. 6B). Thus, the thin film integrated circuits 112, 118, and 119 are sealed with the second substrate 121 and the third substrate 122.

Figure 7A:
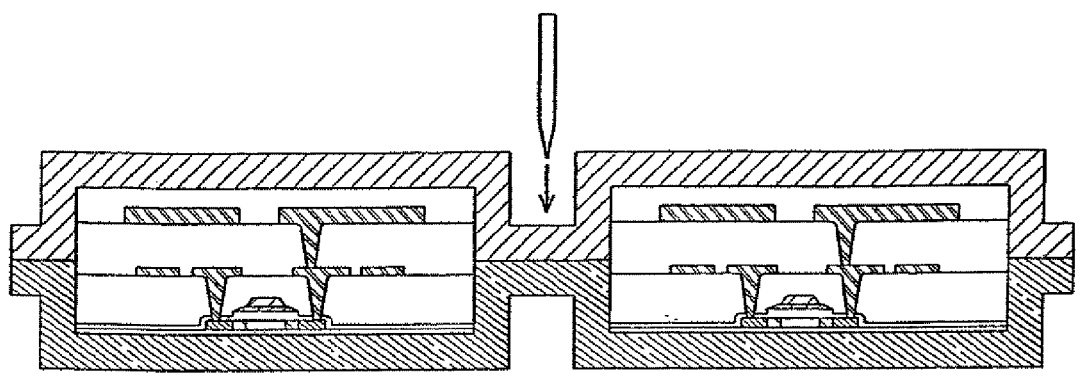
FIGS. 7A and 7B are figures showing a method for manufacturing an IC chip.
Figure 7B:
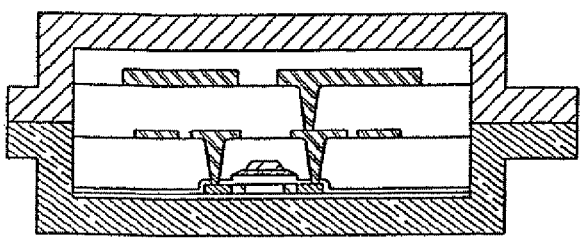

A part of each of the second substrate 121 and the third substrate 122 between the respective thin film integrated circuits 112, 118, and 119 is cut by dicing, scribing, or laser cutting. Thus, a sealed IC chip is completed (FIGS. 7A and 7B).

An IC chip sealed through the above steps has the size of 5 mm square (25 $mm^2$) or less, preferably, 0.3 mm square (0.09 $mm^2$) to 4 mm square (16 $mm^2$).

Since a thin film integrated circuit formed over an insulating substrate is used for an IC chip according to the invention without using a silicon substrate; therefore, the IC chip has less limitations in the shape of the mother substrate compared with a chip formed from a circular silicon wafer. That increases the productivity of IC chips and makes it possible to mass-produce the IC ships. Consequently, cost of IC chips can be reduced. Further, a semiconductor film with a thickness of 0.2 µm or less, typically, 40 nm to 170 nm, preferably, 50 nm to 150 nm is used for an IC chip according to the invention; thus, the IC chips are very thin compared with a chip formed from a silicon substrate. As a result, the presence of a thin film integrated circuit is hardly noticed even when it is applied to an article, which leads to protection against falsification. Further, an IC chip according to the invention can receive signals with high sensitivity without electromagnetic wave absorption compared with an IC chip formed from a silicon substrate. In the case where a silicon substrate is not used, the thin film integrated circuit can have light-transmitting properties. Therefore, the IC chip according to the invention can be applied to various articles, for example, it can be mounted on a printed surface without spoiling the design. This embodiment mode can be freely combined with any one of the above embodiment modes.

Embodiment 1

An IC chip formed with the use of a laminating system according to the invention includes a plurality of elements, and a conductive layer serving as an antenna. The plurality of elements correspond to a thin film transistor, a capacitor, a resistor, and a diode, for example.

Figure 9:
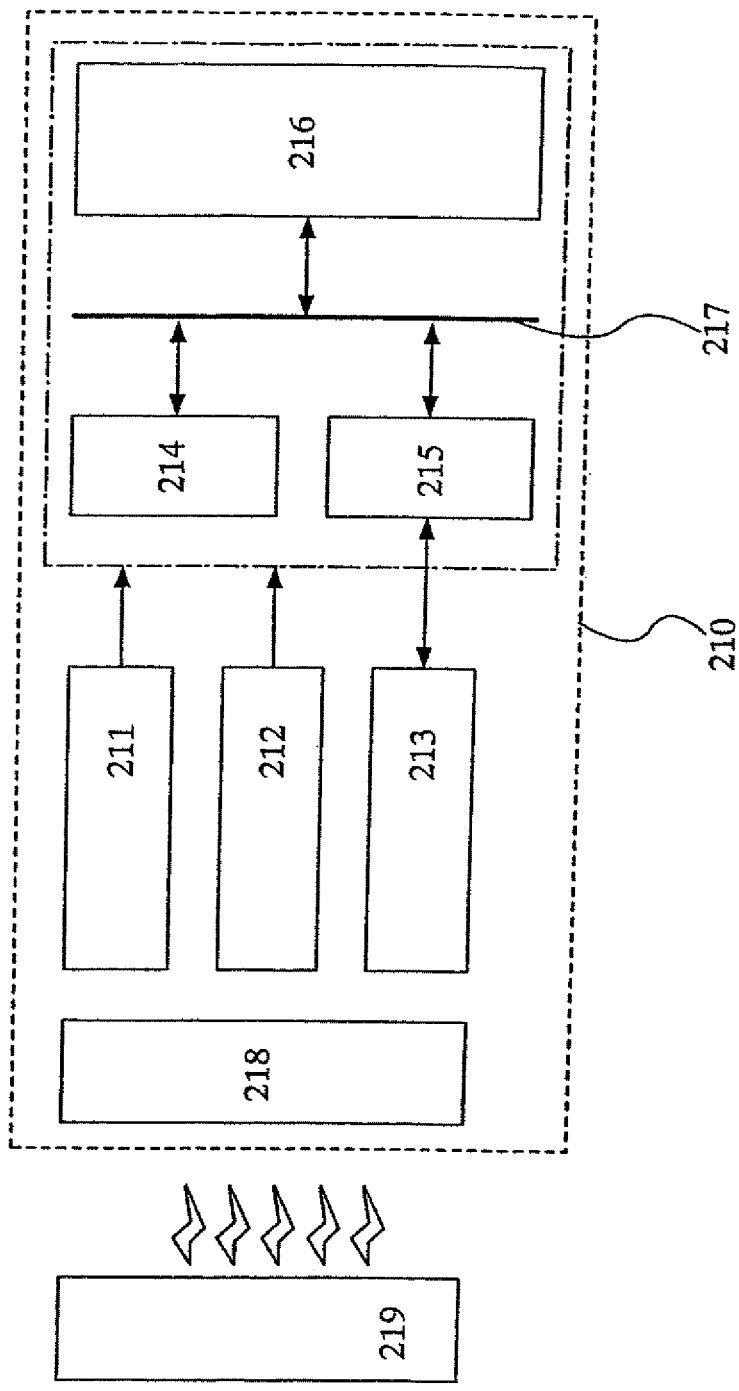
FIG. 9 is a figure showing an IC chip.

An IC chip 210 has a function of communicating data without contact, and constitutes a variety of circuits. For example, a power circuit 211, a clock generator circuit 212, a data demodulation/modulation circuit 213, a control circuit 214 (corresponding to a CPU or an MPU, for example), an interface circuit 215, a memory 216, a data bus 217, an antenna (also referred to as an antenna coil) 218, and the like are provided (FIG. 9).

The power circuit 211 is a circuit which generates a variety of power source which is to be supplied to the above respective circuits based on an AC signal inputted from the antenna 218. The clock generator circuit 212 is a circuit for generating various clocks to be supplied to the above respective circuits based on an AC signal inputted from the antenna 218. The demodulation/modulation circuit 213 has a function of demodulating/modulating data in communication with a reader/writer 219. The control means 214, for example, corresponds to a central processing unit (CPU), a micro processor unit (MPU), or the like and has a function of controlling other circuits. The antenna 218 has a function of transmitting and receiving electromagnetic wave. The reader/writer 219 controls processes regarding communication with a thin film integrated circuit, control of the thin film integrated circuit, and data of the thin film integrated circuit.

The structure of a circuit constituted by thin film integrated circuits is not limited to the above structure. For example, a structure with another component such as a limiter circuit for source voltage or a hardware dedicated for cryptographic processing may be used.

Embodiment 2

Figure 10B:
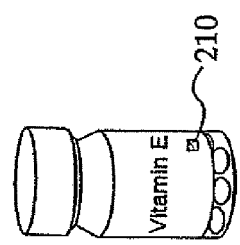
FIGS. 10A to 10E are figures showing usage patterns of IC chips.
Figure 10A:
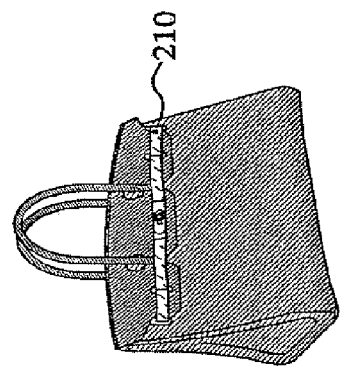
Figure 10D:
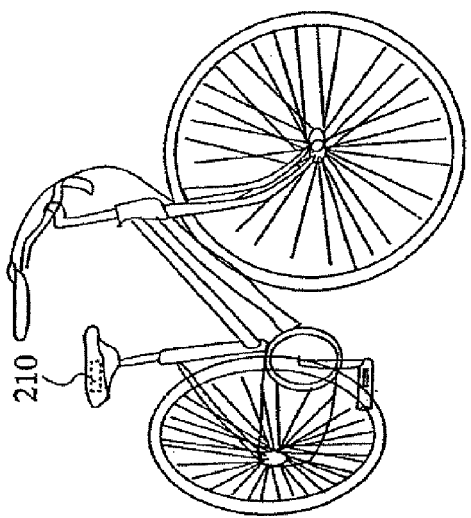
Figure 10E:
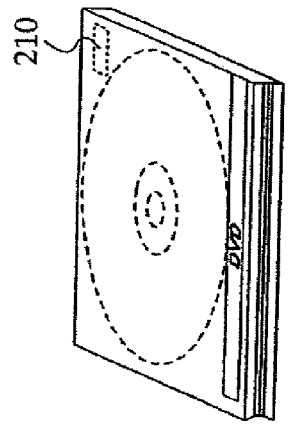
Figure 10C:
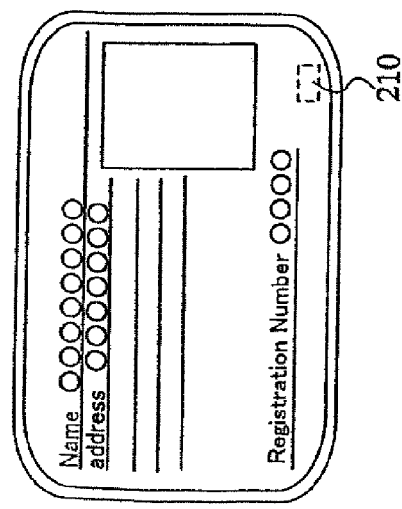

An IC chip manufactured using a laminating system according to the invention is in wide use. For example, IC chips 210 can be used in paper money, coin, securities, bearer bonds, a certificate (such as a driver's license, a resident's card (FIG. 10A)), a packing case (such as a wrapper, or a bottle (FIG. 10B)), a storage medium (such as a DVD, a video tape (FIG. 10C)), a vehicle (such as a bicycle (FIG. 10D)), belongings (such as a bag, glasses (FIG. 10E)), food, clothing, commodities, and electronics. Electronics include a liquid crystal display device, an EL display device, a television device (also referred to as TV or a television receiver), and a cellular phone.

An IC chip is fixed to an article by attaching it onto the surface of the article, embedding it in the article, or the like. For example, an IC chip may be embedded in paper of a book, or in an organic resin of a package formed of an organic resin. Paper money, coin, securities, bearer bonds, a certificate, or the like may be provided with an IC chip, so that forgery can be prevented. Further, a packing case, a storage medium, belongings, foods, commodities, and electronics may be provided with IC chips, so that efficiency of an inspection system, a system for a rental shop, or the like can be improved. Vehicles may be provided with IC chips, so that forgery or robbery can be prevented.

Figure 11A:
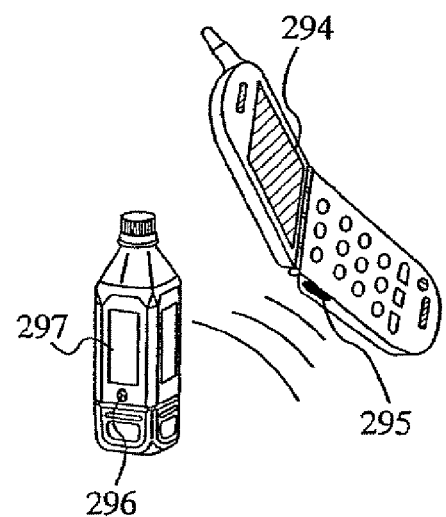
FIGS. 11A and 11B are figures showing usage patterns of IC chips.
Figure 11B:
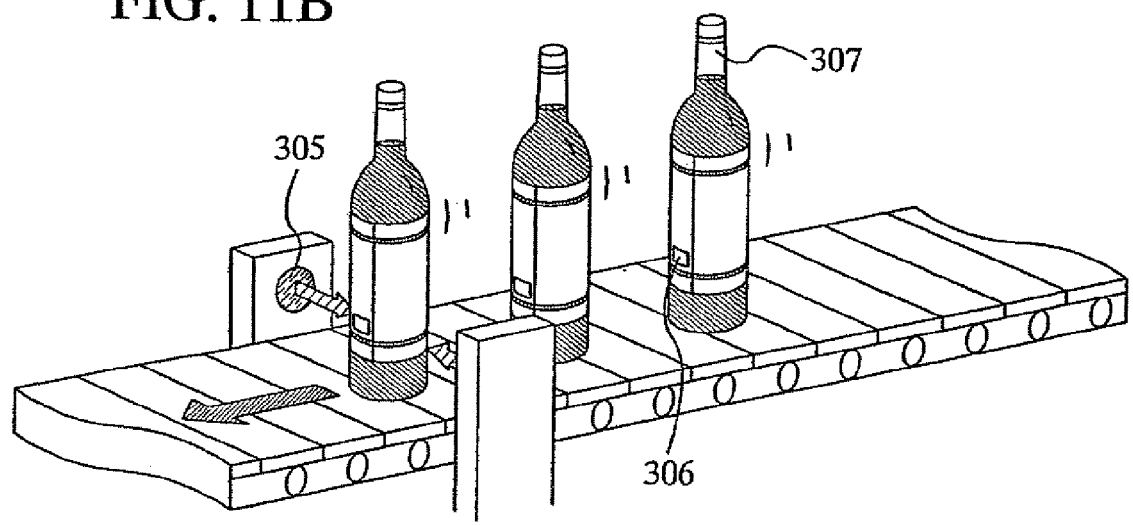

Further, IC chips may be applied to a system of commodity management and commodity distribution, so that the functionality of the system can be improved. For example, a side surface of a portable terminal including a display area 294 is provided with a reader/writer 295, and a side surface of an article 297 is provided with an IC chip 296 (FIG. 11A). In this case, when the IC chip 296 is held to the reader/writer 295, information of the article 297 such as the raw materials, the place of origin, the history of distribution, or the like are displayed on the display area 294. As an alternative, a reader/writer 305 can be provided at the side of a conveyer belt (FIG. 11B). In this case, an article 397 can be easily checked using an IC chip 306 provided on a side surface of the article 397.

What is claimed is:

1. A method comprising:
   forming a release layer over a first substrate;
   forming a circuit over the release layer, the circuit comprising a transistor;
   rotating a peeling roller to attach a first surface of the circuit to a second substrate so that the circuit comprising the transistor is separated from the release layer;
   rotating a first roller and a second roller to attach a second surface of the circuit to a third substrate;
   sealing the circuit between the second substrate and the third substrate by performing a pressure treatment and a heat treatment while the circuit passes between the first roller and the second roller; and
   rotating a receiving roller to wind the circuit which is sealed with the second substrate and the third substrate,
   wherein the first surface and the second surface are opposed to each other.

2. The method according to claim 1,
   wherein the release layer comprises at least one of tungsten, molybdenum, titan, tantalum, niobium, nickel, cobalt, zirconium, zinc, ruthenium, rhodium, palladium, osmium, iridium, and silicon.

3. The method according to claim 1 is a method for forming an IC chip.

4. A method comprising:
   forming a release layer over a first substrate;
   forming a circuit over the release layer, the circuit comprising a transistor;
   attaching a first surface of the circuit to a second substrate so that the circuit comprising the transistor is separated from the release layer;
   attaching a second surface of the circuit to a third substrate; and
   rotating a first roller and a second roller to seal the circuit,
   wherein the first surface and the second surface are opposed to each other, and
   wherein the circuit is sealed by performing a pressure treatment and a heat treatment while the circuit passes between the first roller and the second roller.

5. The method according to claim 4 is a method for forming an IC chip.

6. A method comprising:
   forming a release layer over a first substrate;
   forming a circuit over the release layer, the circuit comprising a transistor;
   rotating a peeling roller to attach a first surface of the circuit to a second substrate so that the circuit comprising the transistor is separated from the release layer;
   attaching a second surface of the circuit to a third substrate; and
   sealing the circuit between the second substrate and the third substrate by performing a pressure treatment and a heat treatment,
   wherein the first surface and the second surface are opposed to each other.

7. The method according to claim 6,
   wherein the release layer comprises at least one of tungsten, molybdenum, titan, tantalum, niobium, nickel, cobalt, zirconium, zinc, ruthenium, rhodium, palladium, osmium, iridium, and silicon.

8. The method according to claim 6 is a method for forming an IC chip.

9. The method according to claim 4,
   wherein the release layer comprises at least one of tungsten, molybdenum, titan, tantalum, niobium, nickel, cobalt, zirconium, zinc, ruthenium, rhodium, palladium, osmium, iridium, and silicon.

* * * * *